United States Patent
Yaegashi et al.

(10) Patent No.: US 6,531,722 B2
(45) Date of Patent: Mar. 11, 2003

(54) BIPOLAR TRANSISTOR

(75) Inventors: Seiji Yaegashi, Yokohama (JP); Kenji Kotani, Yokohama (JP); Masaki Yanagisawa, Yokohama (JP); Hiroshi Yano, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/082,124

(22) Filed: Feb. 26, 2002

(65) Prior Publication Data
US 2002/0117665 A1 Aug. 29, 2002

(30) Foreign Application Priority Data

Feb. 26, 2001 (JP) ......................... 2001-050448

(51) Int. Cl.[7] ........................... H01L 31/0328
(52) U.S. Cl. ......................... 257/197; 438/312; 257/198
(58) Field of Search ................ 257/197, 198, 257/183, 565; 438/312, 313, 315, 317

(56) References Cited

U.S. PATENT DOCUMENTS

| | | | |
|---|---|---|---|
| 5,001,534 A | 3/1991 | Lunardi et al. ............... 357/34 |
| 5,672,522 A * | 9/1997 | Streit et al. .......... 148/DIG. 10 |
| 5,981,985 A | 11/1999 | Yang et al. .................. 257/198 |
| 6,333,236 B1 * | 12/2001 | Koganei ..................... 257/197 |
| 6,403,991 B1 * | 6/2002 | Kurokawa et al. .......... 257/197 |

* cited by examiner

Primary Examiner—Tuan H. Nguyen
(74) Attorney, Agent, or Firm—Smith, Gambrell & Russell, LLP

(57) ABSTRACT

The present invention relates to a hetero-bipolar transistor. This transistor comprises a semi-insulating InP substrate, a buffer layer on the substrate, a sub-collector layer on the buffer layer, a collector layer on the sub-collector layer, a base layer on the collector layer, a wide-gap emitter layer on the base layer and a emitter contact layer on the emitter layer. The emitter layer extends the emitter contact layer, so the edge of the emitter layer is apart from the emitter contact layer and entirely covers the region where the collector layer and the sub-collector layer are overlapped to each other. According to this configuration, the transistor shows the enhanced reliability and the improved high frequency performance.

14 Claims, 6 Drawing Sheets

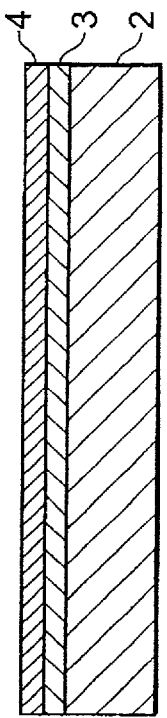
Fig. 2(A)
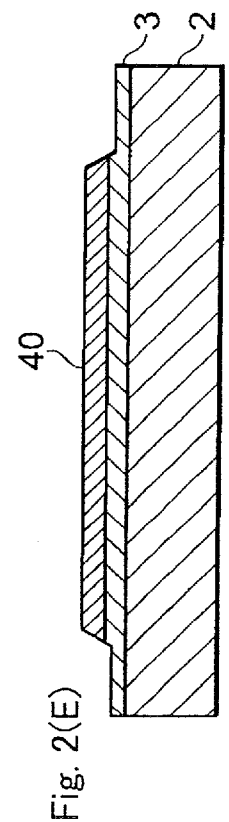
Fig. 2(B)
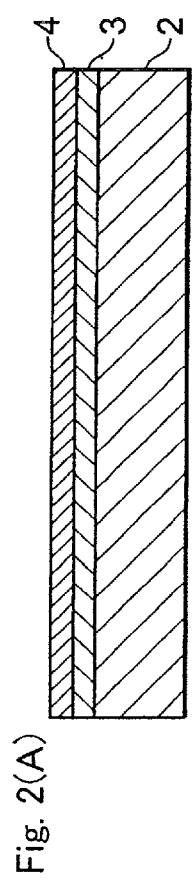
Fig. 2(D)
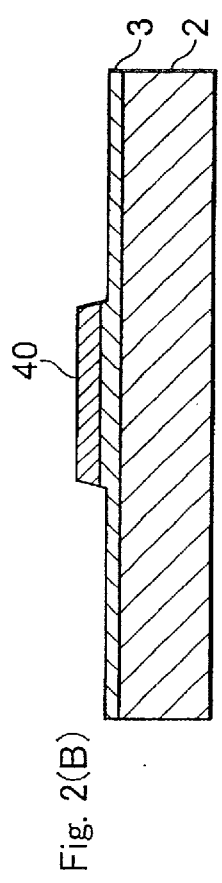
Fig. 2(E)
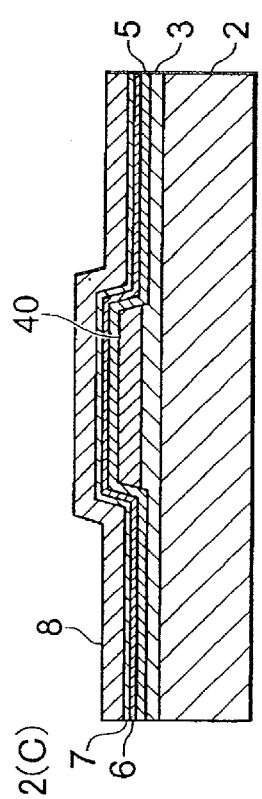
Fig. 2(C)
Fig. 2(F)

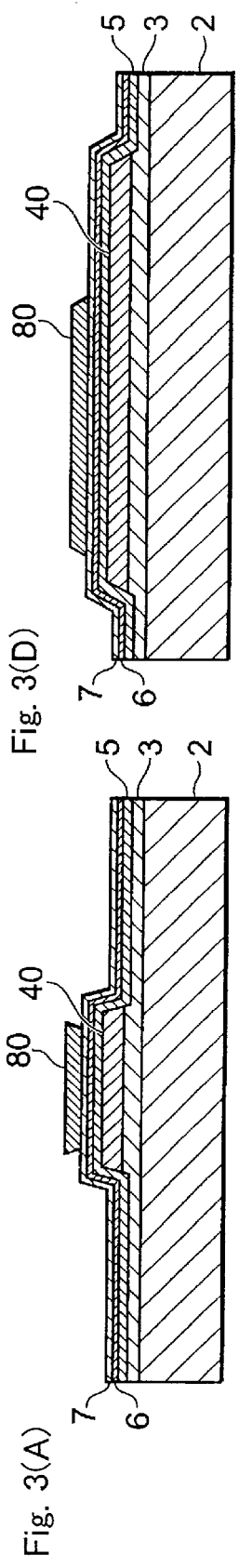
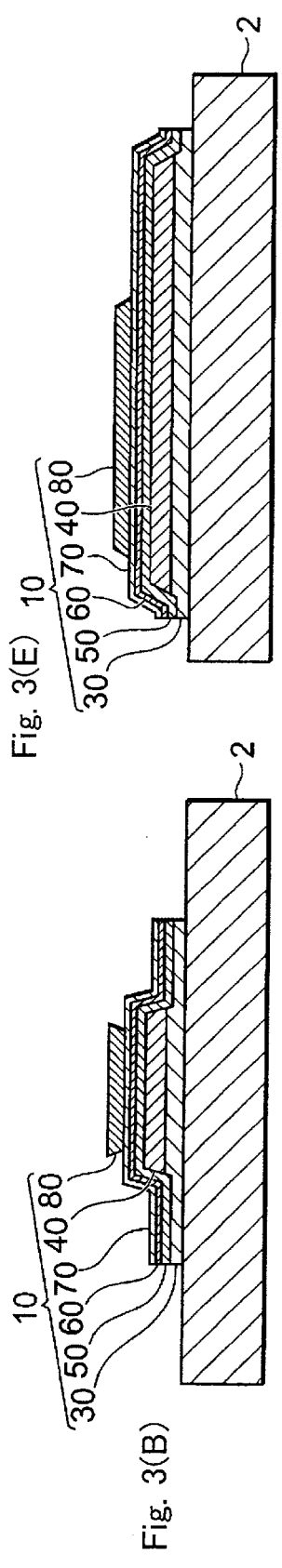
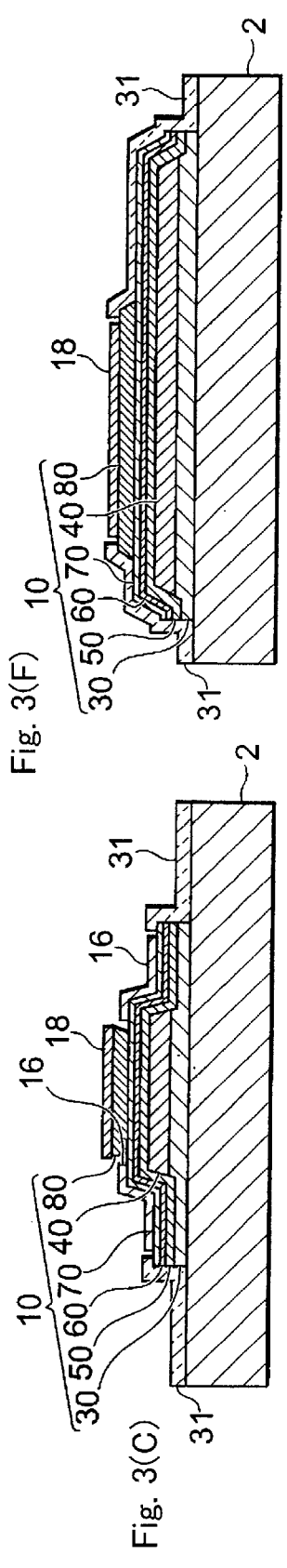

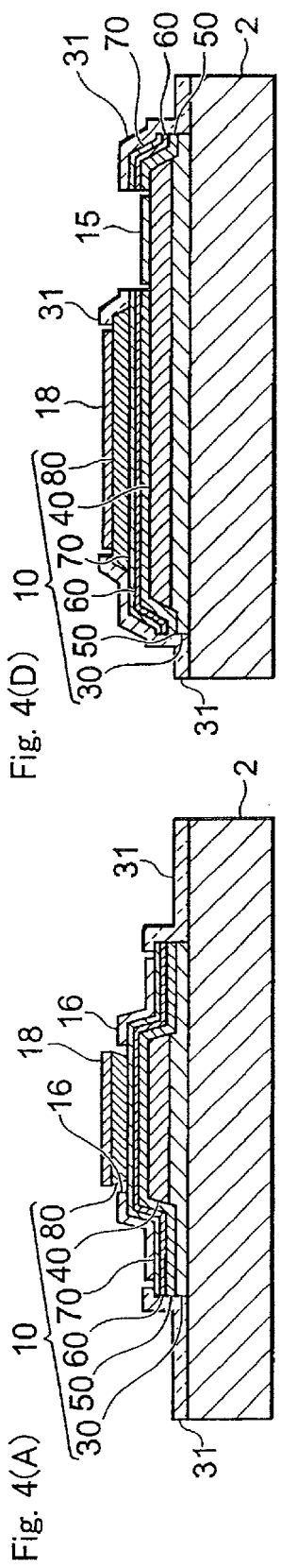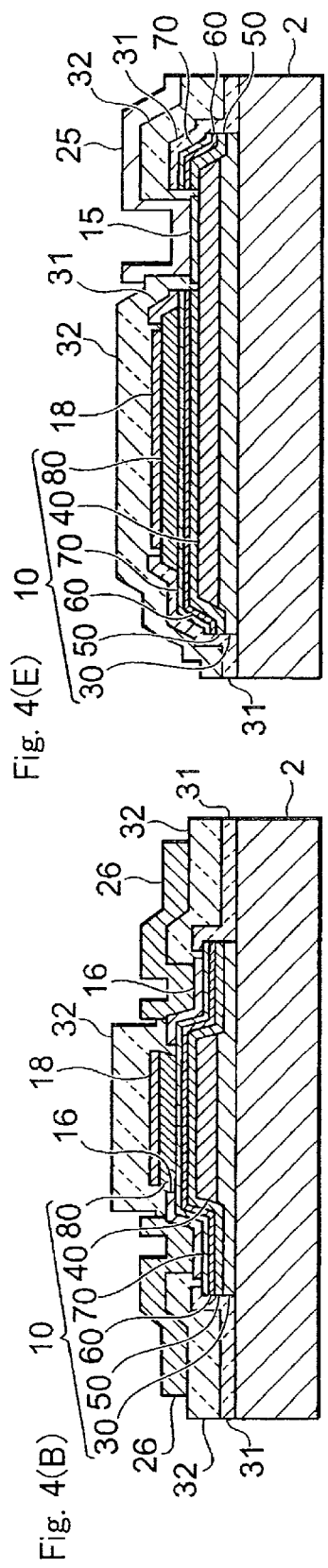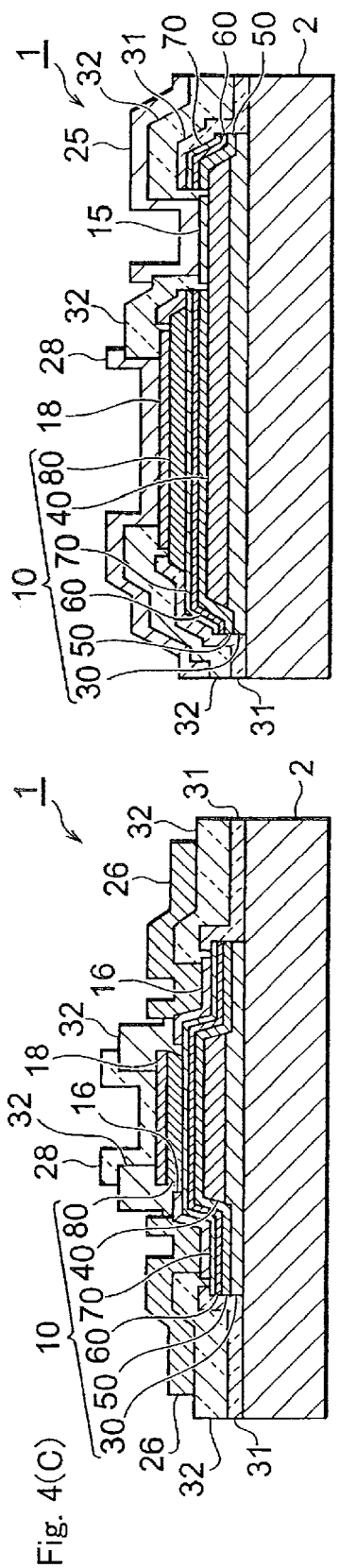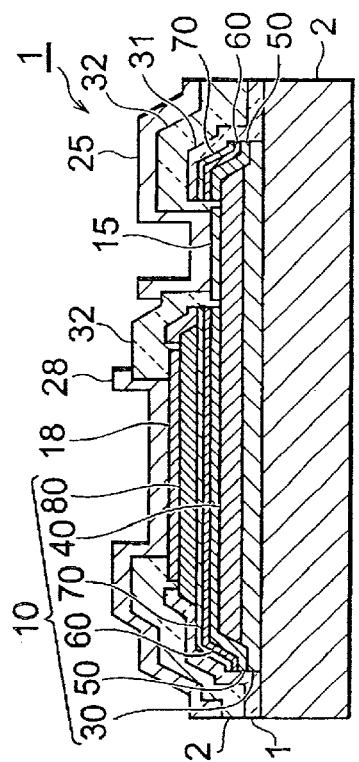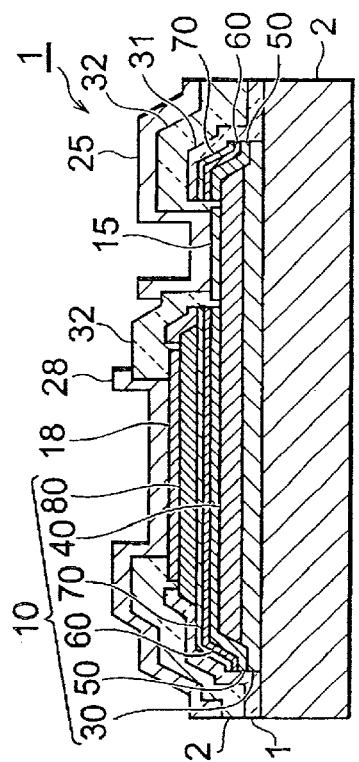

BIPOLAR TRANSISTOR

BACKGROUND OF THE INVENTION

1. Field of the Invention

The present invention relates to a Hetero-Bipolar-Transistor (HBT) made of III–V group compound semiconductors.

2. Related Prior Art

The HBT having a high current gain and an excellent high frequency performance is going to utilize as an amplifying device for an optical transceiver in high-speed optical communications. The reason HBT shows such superior performance is that a semiconductor material is use in an emitter region, whose energy gap is wider than that used in a base region. Due to this wide gap emitter, a carrier injection into the emitter region can be maintained large even in the high carrier concentration in the base region, thus shows the excellent high frequency performance.

Although the HBT is an attractive device due to its high-speed characteristics and has improved mainly in this frequency performance, similar to other electron devices and optical devices, it is necessary to pay attentions to not only the high-speed characteristics but also its reliability.

In conventional HBTs, several semiconductor layers are sequentially grown. A collector layer composed of InGaAs, a base layer composed of InGaAs, and an emitter layer composed of InP are grown on the substrate in this order. After the growth, several times of etchings of respective layer form an emitter mesa structure and a base mesa structure. A collector electrode, a base electrode, and an emitter electrode are formed on the collector, the base, and the emitter, respectively. Thus, the HBT is completed.

In such conventional HBTs, a portion of the base layer, where the emitter mesa structure is formed thereon, operates as an intrinsic base. Since the emitter layer is formed just underneath the emitter mesa structure, side surfaces of the emitter layer are exposed to ambient. The edge of the interface between the emitter layer and the base layer, which is coincide with side surfaces of the emitter layer, is close to the intrinsic base. Therefore, it is favorable for the reliability to locate side surfaces of the emitter layer apart from the intrinsic base region.

SUMMARY OF THE INVENTION

The object of the present invention is to provide the new structure of HBT with high reliability.

The device according to the present invention comprises a semiconductor substrate, a sub-collector layer on the substrate, a collector layer on the sub-collector layer, a base layer made of InGaAs on the collector layer, an InP layer on the base layer, and an emitter contact layer made of InGaAs on the emitter layer. The InP layer is provided within a first region on a primary surface of the substrate. The InGaAs emitter contact layer is provided within a second region contained in the first region. Besides, the emitter contact layer is provided within a region where the sub-collector and the collector are overlapped to each other.

Since a projected area of the emitter contact layer upon the substrate is smaller than that of the InP layer, the portion of the InP layer just underneath the emitter contact layer is able to behave as an intrinsic emitter. The configuration that the intrinsic emitter is apart from side surfaces of the InP layer enhances the reliability of the HBT.

On the second aspect of the present invention, the HBT comprises a substrate, a sub-collector layer on the substrate, a collector layer on the subcollector layer, an InGaAs base layer on the collector layer, an InP layer on the base layer, and an emitter contact layer on the InP layer. The InP layer is provided within a first region on a primary surface of the substrate, and the emitter contact layer is provided within the second region involved in the first region. The second region includes the portion where the collector layer and the sub-collector layer are overlapped to each other and regions surrounding the overlapping portion.

Even in the configuration of the second aspect of the invention, since the effective emitter is formed in the region where the InGaAs emitter contact layer and the InP layer are overlapped to each other, the intrinsic emitter is apart from side edge of the InP layer, thus enhances the reliability.

When the sub-collector layer is formed in an island shape, inclined surfaces are exposed in the edge of the sub-collector layer. The semiconductor material grown onto such inclined surfaces shows different etching endurance from those formed on the plane surface. Therefore, it is likely to be caused the defect, such as etching pit, when semiconductor layers grown onto the inclined surface is soaked into the etching solution. According to the present invention, since the emitter contact layer covers such inclined surfaces, it is never exposed to the etchant, thus restrained from the creation of the defect and so prevented from deterioration.

The HBT of the present invention comprises a base electrode formed on a region where the base layer and the InP layer are overlapped therein. In this configuration, since the InP layer extends under the base electrode, the intrinsic emitter region contacting to the emitter contact layer is enable to be apart from side surfaces of the InP layer.

It is favorable that the thickness of the InP layer is so as to make carriers tunneling therethrough. In this configuration, the base current flows from the base electrode to the base layer or from the base layer to the base electrode.

It is further favorable that the InGaAs emitter contact layer has the inverse mesa structure and the base electrode faces the side surfaces of such inverse mesa structure of the emitter contact layer. The inverse mesa structure has a form like a trapezoid, in which the lower side of parallel lines is shorter than that of the higher side. Due to this shape, an emitter electrode and a base electrode are obtainable through the self-aligned process. Since respective electrodes are electrically isolated to each other while the distance between the electrodes is close enough, the base resistance can be reduced, thus, enhances the high frequency performance.

Moreover, it is further favorable to form the sub-collector layer so as to have a normal mesa structure and to be covered with the collector layer.

BRIEF DESCRIPTION OF DRAWINGS

FIG. 2(A) to FIG. 2(C) show the cross sectional view along [01-1] axis at the primary manufacturing step, while FIGS. 2(D) to 2(F) show cross sectional view along [011] axis of the first embodiment;

FIGS. 3(A) to 3(F) show the cross sectional view along [01-1] axis at the primary manufacturing step following to FIGS. 2(A) to 2(C), while FIGS. 3(D) to 3(F) show along [011] axis;

FIGS. 4(A) to 4(C) show the cross sectional view along [01-1] axis at primary manufacturing steps following to FIGS. 3(A) to 3(C), while FIGS. 4(D) to 4(F) show along [011] axis;

DESCRIPTION OF THE PREFERRED EMBODIMENTS

The favorable embodiments of the present invention will be described, especially the npn type bipolar transistor made of group III–V compound semiconductor materials. In the description, elements identical to each other will be referred to with numerals identical to each other without their overlapping explanations. In drawings, dimensions such as layer thickness of respective elements will not always reflect their explanation. Also, indices of crystal surface and crystal axis appeared in the description will contain their equivalent.

The First Embodiment

Figure 1A:
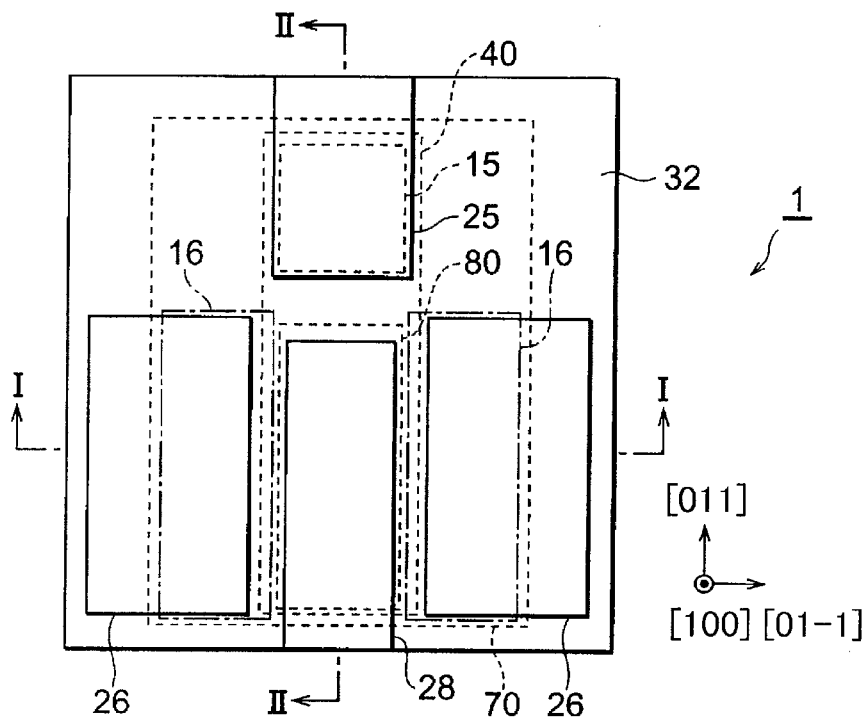
FIG. 1(A) shows a plane view of the first embodiment of the invention.
Figure 1B:
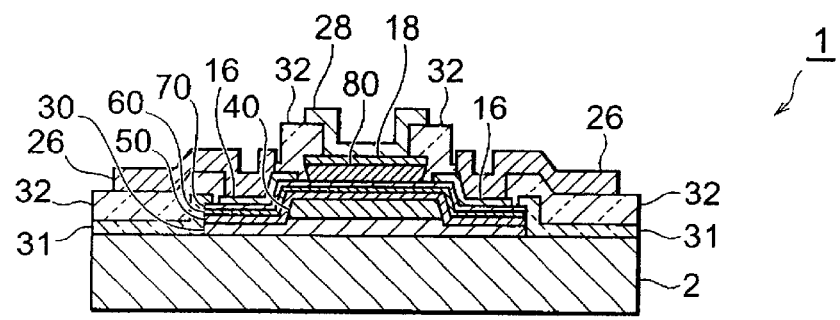
FIG. 1(B) shows a cross sectional view along I—I in the FIG. 1(A)
Figure 1C:
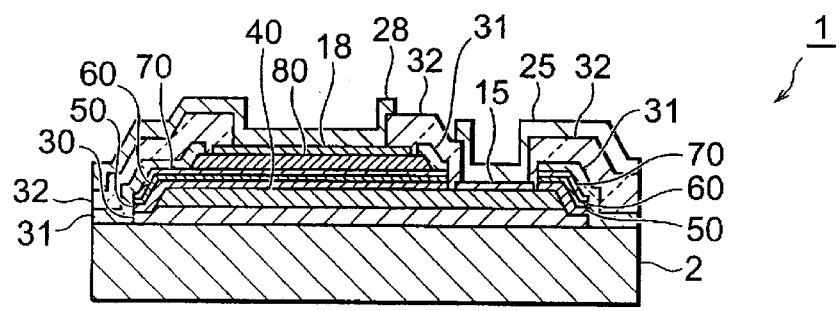
FIG. 1(C) shows a cross sectional view along II—II in the FIG. 1(A)

The first embodiment of the present invention will be explained. FIG. 1(A) is a plane view of the first embodiment and FIG. 1(B) is a sectional view along a line I—I in FIG. 1(A). Also, FIG. 1(C) is a sectional view along a line II—II in FIG. 1(A). The line I—I and the line II—II are along [01-1] and [011] crystal axes, respectively, of the semiconductor substrate that the HBT is formed thereon.

In FIG. 1(B), the HBT 1 has a semi-insulation InP substrate 2, a buffer layer 30 on the (100) surface of the substrate 2, a sub-collector layer 40 on the buffer layer 30, a collector layer 50 on the sub-collector layer 40, a base layer 60 on the collector layer 50, an emitter layer 70 on the base layer 60, and the emitter contact layer 80 on the emitter layer 70.

Furthermore, HBT 1 has a collector electrode 15 on the sub-collector layer 40 as shown in FIG. 1(C), a base electrode 16 on the emitter layer 70 and an emitter electrode 18 on the emitter contact layer 80, as shown in FIG. 1(B). Conductive wiring are connected to the respective electrodes, that is, wiring 25 on the collector electrode 15, wiring 26 on the base electrodes 16, and wiring 28 on the emitter electrode 18.

The HBT 1 has insulating films (31, 32) to isolate respective electrodes (15, 16, and 18) and to protect semiconductor layers. The insulating films are made of, for example, silicon nitride ($Si_3N_4$, herein after denoted as SiN).

The buffer layer 30 is made of un-doped $In_xGa_{1-x}As$ and its thickness from 300 nm to 500 nm. The sub-collector layer 40 is n-type $In_xGa_{1-x}As$ with thickness from 300 nm to 500 nm. As shown in figures from 1(A) to 1(c), the sub-collector layer 40 is formed as substantially rectangle shape with its long side along the [011] axis of the substrate. Moreover, side surfaces of the sub-collector layer 40 are formed as normal mesa structures as shown in FIGS. 1(B) and 1(C). The sub-collector 40 is doped with Si and its electron concentration has a range from $0.5 \times 10^{19}$ to $2.0 \times 10^{19}$ ($cm^{-3}$).

The collector layer 50 is an n-type $In_xGa_{1-x}As$ with its thickness from 300 nm to 500 nm The collector layer 50 is formed as substantially rectangle shape with its long side along [011] axis and the other side along [01-1] axis. The collector layer 50 is doped with Si and its electron concentration is the range from $1.0 \times 10^{16}$ to $5.0 \times 10^{16}$ ($cm^{-3}$). The base layer 60 is p-type $In_xGa_{1-x}As$ with a thickness of about 50 nm. The base layer 60 is doped with Zn or C, and hole concentration from $1.0 \times 10^{19}$ to $3.0 \times 10^{19}$ ($cm^{-3}$).

The emitter layer 70 is an n-type InP with thickness of about 10 nm. The emitter layer 70 has the identical plane shape with that of the base layer 60. The emitter layer 70 is doped with Si and the electron concentration is $4.0 \times 10^{18}$ ($cm^{-3}$). The favorable thickness of the layer 70 is from 5 nm to 20 nm, since the function of the emitter layer is failed below 5 nm while the current tunneling through the emitter layer 70 will be hard over 20 nm, which leads the inferior performance of the transistor.

The emitter contact layer 80 is an n-type $In_xGa_{1-x}As$ and formed so as to be contained the sub-collector layer 40 therein. The layer 80 has side surfaces formed along the [011] axis, which show reverse mesa structures. The thickness of the layer 80 is about 250 nm. The carrier concentration of the layer 80 is divided into two regions. One is formed within about 50 nm from the interface to the emitter layer 70 and the electron concentration is about $5.0 \times 10^{18}$ ($cm^{-3}$), while the other is formed on the former region and the electron concentration is about $2.0 \times 10^{19}$ ($cm^{-3}$) larger than that of the former region. The reason to divide the emitter contact layer 80 into two layers is to realize the small contact resistance between the emitter electrode 18 and the emitter contact layer 80.

The base layer 60, collector layer 50, and sub-collector layer 40 are made of $In_xGa_{1-x}As$ and the constitutions of In or Ga are so selected to match the lattice constant of the layers to the InP substrate, in which x equals to 0.53. The lattice matching means the difference of the lattice constant between layers of $In_xGa_{1-x}As$ and the InP substrate is within ±0.1%.

As shown in FIG. 1(C), the collector electrode 15 is formed on the sub-collector layer 40, while the base electrode 16 is formed on the emitter layer 70 apart from the emitter contact layer 80 and facing the one side of the emitter contact layer 80. The emitter electrode 18 is formed on the emitter contact layer 80. The respective electrodes are made of Titanium (Ti), Platinum (Pt), and Gold (Au) successfully deposited in this order. A number of conductive wiring made of, for example Aluminum (Al), is connected to respective electrodes. Since the cross sectional shape of the sub-collector layer 40 has normal mesa structures, the base electrode 16 is bent by obtuse angle at the edge of the sub-collector layer and the stress applied to the base electrode 16 is be reduced.

Next will be described the operation of the HBT 1. Assuming the configuration of the emitter grounding, the current flows from the base electrode 16 to the emitter electrode 18 by the bias potential applied between the electrodes. The injected carriers from the base electrode 18 penetrates to the base layer 60 through the emitter layer 70 is conveyed in the base layer 60 to the region where the emitter contact layer 80 is formed, and reaches the emitter electrode 18 through the emitter layer 70 by tunneling and conveyed in the emitter contact layer 80.

The current from the collector electrode 15 to the emitter electrode 18 flows concurrently with the current from the base electrode 16 to the emitter electrode 18. The injected current from the collector electrode 15 flows in the sub-collector layer 40, the collector layer 50, the base layer 60, the emitter layer 70 by tunneling, and the emitter contact layer 80.

Since the electron concentration in the sub-collector layer 40 is larger than that of the collector layer 50 by three orders or higher in the present embodiment, the current penetrates from the sub-collector layer 40 to the collector layer 50 through entire interface between the layers. The current into the collector layer penetrates to the base laser 60, namely, the region where the current flows in the collector layer 50 provides the function of current amplification. In other words, the sub-collector layer 40 decides the intrinsic collector region in the collector layer 50.

The current from the collector layer 50 to the emitter contact layer 80 flows from the intrinsic collector region to the emitter contact layer 80 through the base layer 60 and the emitter layer 70. The regions where the current flows operate as an intrinsic emitter region and an intrinsic base region. The portion of the emitter layer 70 where the base electrode is formed does not provide a function of the intrinsic emitter region but shows a current flow pass from the base electrode 16 to the emitter electrode 18.

Next is the improvement of the HBT 1. The primary feature of the HBT 1 is derived from the emitter contact layer 80 being formed smaller than the emitter layer 70 and only the region within the emitter layer 70 opposing to the emitter contact layer 80 shows the intrinsic emitter region. That is, the intrinsic emitter region is apart from the edge of the emitter layer 70.

When the intrinsic emitter region is formed by the etching of the emitter layer 70 and has the same area with the emitter contact region 80 like conventional HBTs, edges of the emitter layer 70 are exposed to the ambience. In such a configuration, these edges are treated in various processes. This leads to the less reliability. However, in the present embodiment, though the emitter layer 70 has the same area with the base layer 60, edges of the emitter layer 70 are apart from the intrinsic emitter region. This leads the high reliability of the present HBT.

Furthermore, the base layer 60 is covered by the emitter layer 70 and protected from the extrinsic contamination. When the surface of the base layer 60 is exposed to the ambience, the various surface states would be created and increase the surface leak current due to the presence of the surface states. In the present embodiment, the base layer 60 is wholly covered by the emitter layer 70 and the emitter layer 70 is grown sequentially on the base layer 60, the surface states in the base layer 60 can be reduced and thus the leak current. Since the thickness of the emitter layer is so thin, the base electrode 16 can be formed directly onto the emitter layer 70.

Another advantage of the HBT 1 is the improvement of the high frequency performance because of the reduction of the capacitance between the base electrode and the collector electrode. Since the sub-collector 40 is covered by the collector layer 50 in the region where the base electrode is formed, the capacitance between electrodes can be reduced. Typical high frequency characteristics according to the present HBT show the cut-off frequency $f_T$ over 120 GHz (@ 20 mA collector current), the maximum oscillation frequency $f_{MAX}$ over 90 GHz (@ 5 mA collector current).

Next is an explanation of the manufacturing process of the HBT 1. From FIG. 2(A) to FIG. 2(F), from FIGS. 3(A) to 3(F), and from FIGS. 4(A) to 4(F) show the cross sectional view of the HBT at each process steps. From FIGS. 2(A) to 2(C), from FIGS. 3(A) to 3(C), and from FIGS. 4(A) to 4(C) show the cross sectional view of the HBT along the [01-1] axis of the semiconductor substrate. Further, the cross sectional views along the [011] axis are shown in figures from 2(D) to 2(F), from 3(D) to 3(F) and 4(D) to 4(F). Pairs of FIG. 2(A) and 2(D), FIG. 2(B) and 2(E), FIG. 2(C) and 2(F) show views at the same process step. Also, figures from 3(A) to 3(A) and figures from 4(A) to 4(F) show views at same process steps, respectively.

The manufacturing method of the HBT of the first embodiment previously shown is divided roughly into three steps. That is, a sub-collector formation step, various mesa formation steps, and an electrode formation step. These steps are processed sequentially.

An epitaxial growth of semiconductors at the sub-collector formation step and the various mesa formation step are executed by the MOCVD (Metal Organized Chemical Vapor Deposition) technology. In the MOCVD, various sources can be utilized, such as the tri-methyl-Indium as an indium source, the tri-ethyl-Gallium as a gallium source, the hydrogen Arsenide for an arsenic source and the hydrogen Phosphate for phosphorous source. The silane ($SiH_4$) is used for the n-type dopant source, while the di-ethyle-Zinc for the p-type dopant source. In the case of carbon doping, carbon bromide is used.

Semiconductor layers with predetermined atomic concentrations and carrier concentrations can be obtained by supplying appropriate sources into the reaction chamber of the MOCVD equipment. Reaction temperatures between 600° C. and 750° C. are favorable. The quality of the obtained semiconductor layer will be poor in temperatures out of above range.

The formation of the sub-collector layer in which the sub-collector mesa region is provided will be described. This process is divided into two steps, one is the epitaxial growth of the semiconductor layer and the other is the etching of the grown layer.

First, as shown in FIGS. 2(A) and 2(D), the buffer material 3 and the sub-collector material 4 are sequentially grown on the (100) surface of the semi-insulating InP substrate 2. The sub-collector material 4 is made of n-type $In_xGa_{1-x}As$ with a thickness from 300 nm to 500 nm and doped with Si. The electron concentration in the sub-collector material is about $1.0 \times 10^{19}$ ($cm^{-3}$). This sub-collector material will be processed to the sub-collector layer 40.

Next, an etching mask made of photo resist is patterned on the sub-collector material 4 by the photolithography. The etching mask shapes nearly rectangle with its one side along [011] axis of the substrate. The prescribed sub-collector layer 40 is obtained by the using this patterned photo resist as an etching mask.

An etchant is the mixture of a sulfuric acid ($H_2SO_4$), a hydrogen peroxide ($H_2O_2$) and a water ($H_2O$). By using this mixture as an etchant, every side surfaces of the sub-collector layer 40 form normal mesa structure as shown in FIG. 2(B) and FIG. 2(E). The etching amount depends on the etching time, which is determined by the pre-experiment. It is favorable to etch the upper portion of the buffer material 3 by about 100 nm, since the portion to be removed within the sub-collector material 4 will be reliably taken off. After removing the photo resist with a solvent, the step for producing the subcollector layer 40 is completed.

The collector layer, the base layer and the emitter layer are formed by (1) the epitaxial growth of respective materials, (2) the etching of the emitter contact layer, and (3) the forming of a mesa where the emitter layer, the base layer and the collector layer are involved.

The InP substrate 2, which the sub-collector layer is formed thereon, is loaded within the reaction chamber of the MOCVD equipment. The collector material 5, the base material 6, the emitter material 7, and the emitter contact material 8 are grown epitaxially sequentially as shown in FIG. 2(c) and 2(F). In the growth, sources containing dopant materials are also supplied to secure predetermined carrier concentrations of the electron and the hole.

The emitter contact material 8 is made of an n-type $In_xGa_{1-x}As$ and is converted to the emitter contact layer 80 in the later process. The thickness of the emitter contact material is about 250 nm. The layer 8 is divided into two portions by its carrier concentration. The lower region is within about 50 nm from the interface to the emitter material 7 and has the electron concentration of about $1.0 \times 10^{18}$ ($cm^{-3}$). The upper region is on the lower portion and has the electron concentration of about $2.0 \times 10^{19}$ ($cm^{-3}$). To form such two regions, the supply amount of the silane ($SiH_4$), which is an n-type dopant, is favorable to change by step-like function. These epitaxial growths of respective materials are shown in FIG. 2(C) and 2(F).

The emitter contact layer 80 is formed as described below. First, a photo resist is patterned on the emitter contact material 8. This photo resist functions as an etching mask and shapes a rectangular with its one side being along [011] axis of the substrate.

After the formation of the etching mask by photo resist, the InP substrate 2 is dipped into an etchant of the mixture of the phosphoric acid ($H_3PO_4$), Hydrogen peroxide ($H_2O_2$), and water ($H_2O$) with its mixture ratio of $H_3PO_4:H_2O_2:H_2O=5:1:10$. This etchant shows the selective etching characteristics of the InGaAs to the InP. The etching rate for the InP emitter material 7 is enough small compared to the InGaAs emitter contact material 8. Therefore, the etching will substantially stop after the exposing of the emitter material 7. One alternative method is to use the non-selective etchant such as the mixture of the sulfuric acid, hydrogen peroxide and water. In the latter case, the etching amount must be determined through a pre-experiment.

After removing of the photo resist by the organic solvent, the emitter contact layer 80 is completed, as shown in FIG. 3(A) and FIG. 3(D). The cross sectional shape of the emitter contact layer 80 appears, as shown in FIG. 3(A), an inverse mesa structure at the side edge extending along the [011], while a normal mesa structure along the [01-1] axis as shown in FIG. 3(D).

Next, another mesa is formed, which contains the emitter material 7, the base material 6, the collector material 5 and the buffer material 3. After the deposition of photo resist pattern on the emitter material 7, which completely to cover the emitter contact layer 80 and shapes nearly rectangular with one side edge extending along the [011] axis of the substrate, two step etchings are executed. First, a portion not covered by the photo resist of the emitter material 7 is removed by the mixture etchant of hydrochloric acid (HCl) and water. Since this mixture shows a selective etching characteristic of the InP to the $In_xGa_{1-x}As$, the $In_xGa_{1-x}As$ under the InP emitter material 8 is hard to be etched. The emitter layer 70 is obtained by this first etching. Then, the base material 7, the collector material 6 and the buffer material 3, all made of $In_xGa_{1-x}As$, are etched by the mixture of the sulfuric acid ($H_2SO_4$), hydrogen peroxide ($H_2O_2$), and water ($H_2O$)=1:1:500. Since this etchant also shows the selective etching characteristics of the $In_xGa_{1-x}As$ to the InP, the InP substrate is hard to remove after the completion of the etching of the $In_xGa_{1-x}As$ material. After the second lo etching, the base layer 70, the collector layer 60, and the buffer layer 30 with predetermined shape are obtained and the mesa region 10 containing layers from 30 to 80 is formed as shown in FIGS. 3(B) and FIG. 3(E).

The primary portion of the HBT is in this mesa region 10 formed through several times of the etching and a region surrounding the mesa region exposes the InP substrate 2. This means that respective HBTs formed on the semi-insulating substrate 2 will be electrically isolated with each other. Thus, the formation step of the mesa region 10 is implicitly equivalent to the device isolation step.

After the completion of mesa region, electrodes are formed. First, the base electrode 16 and the emitter electrode 18 are made by the self-aligned process. A SiN film 31 is deposited by CVD (Chemical Vapor Deposition) technique on the whole substrate 2. After deposition, an etching mask made of photo resist is patterned onto the SiN film 31. The mask has a predetermined shape to expose the portion of the emitter contact layer 80 and the emitter layer 70. The portion of the insulating film not covered by the photo resist is removed by the RIE (Reactive Ion Etching) and the emitter contact layer 80 and the emitter layer 70 are exposed.

Next, two electrodes (16, 18) are formed by Lift-Off process. After the RIE processing, titanium (Ti), platinum (Pt), and gold (Au) are sequentially deposited in the opening region of the photo resist and also onto the photo resist. Since edges along the [011] axis of the emitter contact layer has the inverse mesa structure, metal materials can not be deposited on the emitter layer 70 just under the eaves of the emitter contact layer 80. Therefore, it is able to separate completely the base electrode from the emitter electrode. By using such self-aligned process, two electrodes can be simply obtainable. Moreover, since the self-aligned process is enable to close the base electrode to the intrinsic emitter region, which results on the reduction of the base resistance, the high frequency performance of the HBT will be improved.

By dissolving the photo resist using, for example, acetonic solvent, the metal film left on the photo resist can be removed, the emitter electrode 18 and the base electrode 16 are completed, as shown in FIG. 3(C) and FIG. 3(F). Thermal treatment for one minute under the temperature of 400° C. in the nitrogen ambient makes an ohmic contact to respective semiconductor layers.

Next, a photo resist is patterned so as to make an opening where the collector electrode is formed. The emitter layer 70, the base layer 60, and the collector layer 50 within the opening are removed by the mixture of $H_2SO_4: H_2O_2:H_2O=$ 1:1:500 following the etching of the SiN film by the RIE technique. After the RIE etching, the sub-collector layer 40 is exposed within the opening. The collector electrode 15 is formed by the Lift-Off method. Titanium, Platinum, and gold are sequentially deposited on the sub-collector layer 40 within the opening and also onto the photo resist. By dissolving the resist, metals left on the resist are removed. Finally, the collector electrode is completed as shown in FIG. 4(A) and FIG. 4(D).

Following to the electrode formation, an insulating film 32 such as SiN is deposited so as to cover the respective electrodes (15, 16, and 18) by the CVD technique. The multi-layered mask made of photo resist, Silica and photo resist is formed on the insulating film 32 and patterned so as to make openings where the wiring 25 connecting to the collector electrode 15 and the wiring 26 to the base electrode 16 are formed. After the patterning of the resist, via holes for wiring 25 and 26 to the respective electrodes are formed and wiring metal such as aluminum are deposited within the opening and onto the resist. By dissolving the resist with organic solvent, metals left on the resist are removed and the wiring 25 and 26 are completed as shown in FIG. 4(B) and FIG. 4(E).

Similar process with the wiring for the collector electrode 15 and the base electrode 16 is applied for the wiring 28 for the emitter electrode 18 as shown in FIG. 4(C) and FIG. 4(F). Finally, the HBT 1 is obtained through thus described process.

Second Embodiment

The second embodiment of the present invention will be described. The HBT 100 according to the second embodiment has the same feature as the first embodiment without the configuration of the emitter contact layer, the emitter electrode on the emitter contact layer and the base electrode. The manufacturing process of the second embodiment has the same feature with the first embodiment without the configuration of the etching mask for the emitter contact layer. Only the difference between two embodiments will be described.

Figure 5A:
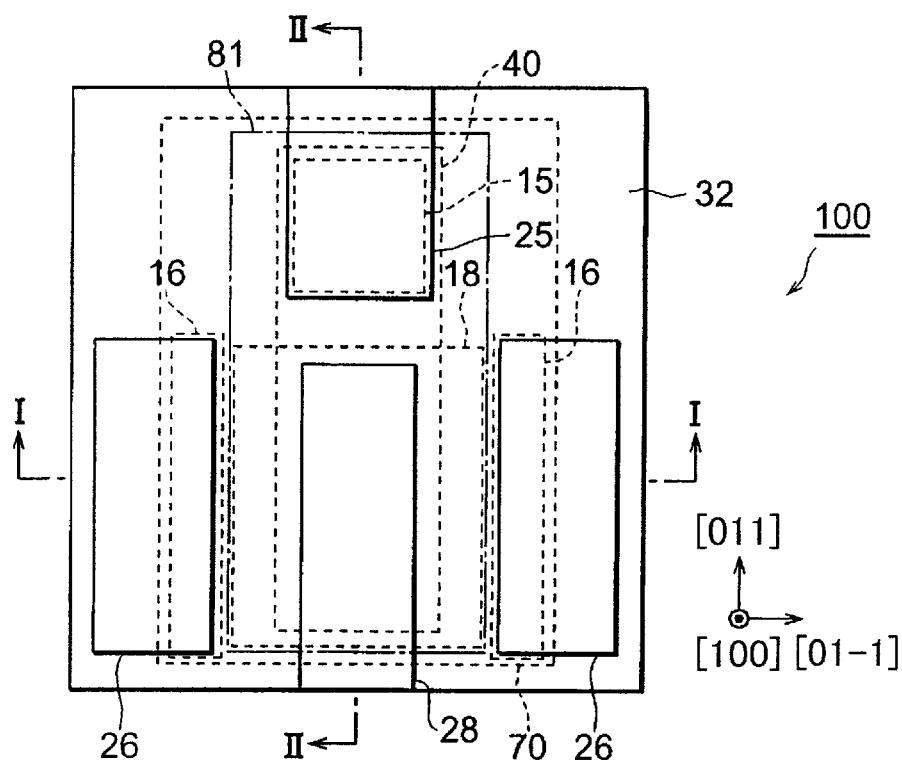
FIG. 5(A) shows the plane view of the second embodiment of the present invention.
Figure 5B:
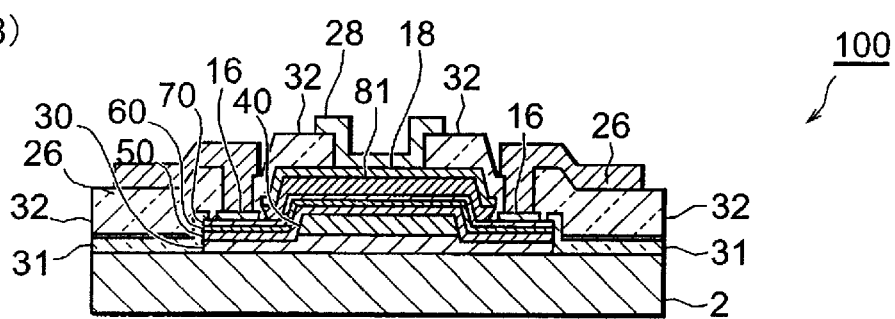
FIG. 5(B) shows a cross sectional view along I—I in the FIG. 5(A)
Figure 5C:
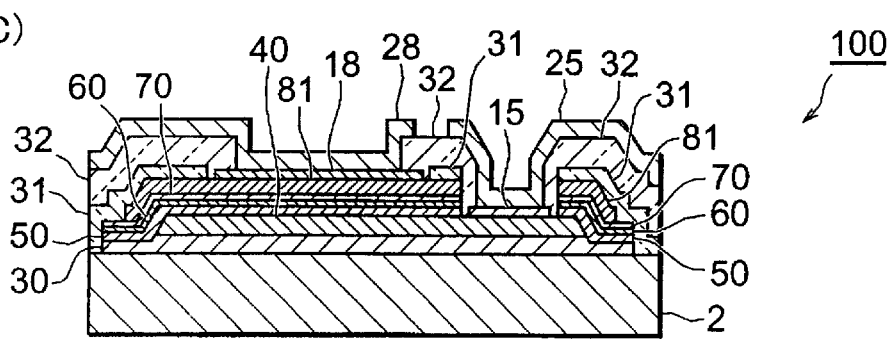
FIG. 5(C) shows a cross sectional view along II—II in the FIG. 5(A)

FIG. 5(A) shows a plane view of the second embodiment of the present HBT 100. FIG. 5(B) is a cross sectional view along a I—I line in the FIG. 5(A), while FIG. 5(C) shows a cross sectional view along a II—II line in the FIG. 5(A). The I—I line and the II—II line in the FIG. 5(A) corresponds to the lines along [011] axis and the [01-1] axis of the semiconductor substrate, respectively.

As shown in figures from 5(A) to 5(C), the area of the emitter contact layer 81 is larger than that of the sub-collector layer 40 in the this embodiment. Moreover, the emitter contact layer 81 covers nearly whole area of the sub-collector layer 40. Even in this configuration, the intrinsic emitter, which functions as the emitter, is restricted to the region directly contact to the emitter contact layer 81. Since side surfaces of the emitter layer 70 are apart from the intrinsic emitter region, the reliability of the HBT of the second embodiment is enhanced.

The second embodiment has another advantages described below. The emitter contact layer 81 covers nearly whole area of the sub-collector layer 40, in other words, the emitter contact layer 81 covers not only the region where the sub-collector layer 40 overlaps the collector layer 50 but the portion surrounding this overlapping region. There are some side surfaces reflecting the mesa structure of the collector layer 50. Since the semiconductor material grown on such side surfaces, which is inclined, shows different etching characteristics from that formed on the plane surface, it is likely to be caused the defect such as etching pit when such side surface is soaked in the etching solution. In the present HBT 100, since side surfaces are covered by the emitter contact layer 81, it is never exposed to the etchant, restrained from the creation of the defect and thus prevented from deterioration.

Furthermore, since the emitter layer 70 covers the base layer 60, the surface states in the base layer 60 is reduced, and so does the leak current.

The Third Embodiment

Next is the explanation of the third embodiment of the present invention. The HBT 101 of the third embodiment has the same feature with the first embodiment except that the base electrode 16 directly contacts to the base layer 60. Also, the manufacturing process has the same feature with that of the first embodiment except that a portion of the emitter layer 70 is removed just before the base electrode formation. Only the difference will be described below.

Figure 6A:
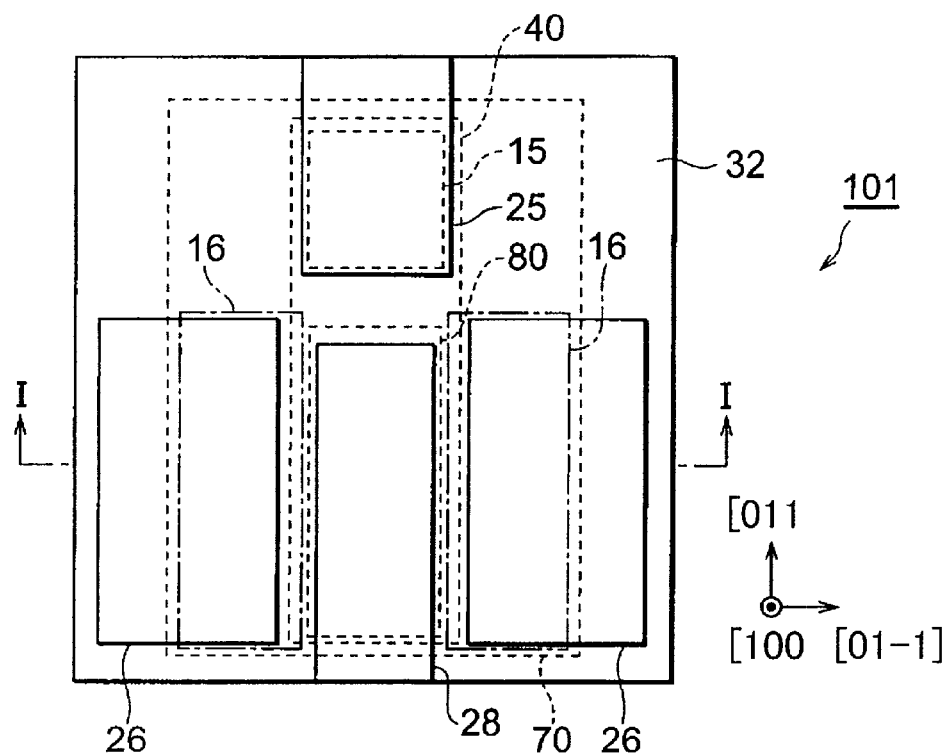
FIG. 6(A) shows the plane view of the third embodiment of the present invention.
Figure 6B:
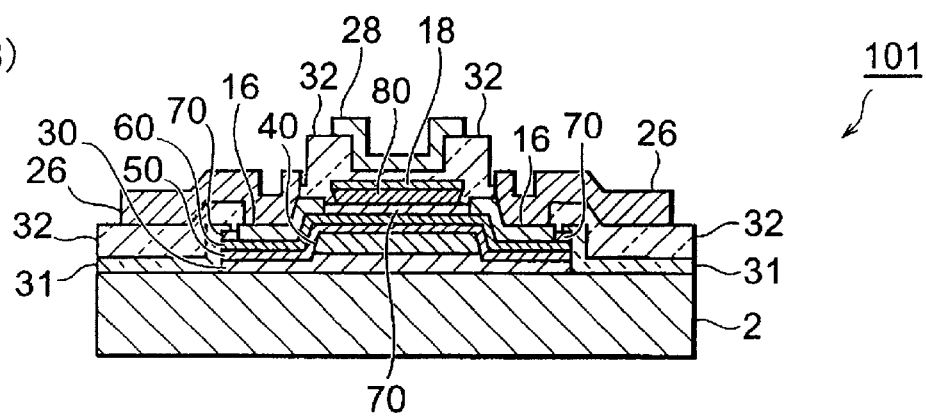
FIG. 6(B) shows a cross sectional view along I—I in the FIG. 6(A).

FIG. 6(B) shows a cross sectional view of the third embodiment along the line I—I in the FIG. 6(A), which corresponds to the [01-1] axis of the substrate.

As shown in the FIG. 6(B), the portion of the emitter layer is removed and the base electrode 16 is formed thereof. Even in such configuration, since edges of the emitter layer are apart from the region where the emitter contact layer 80 and the emitter layer 70 are interfaced, the reliability can be secured as in the case of the first embodiment. One typical example to form such structure is that the portion of the emitter layer 70 is removed by Reactive Ion Etching (RIE) just before the base electrode 16 formation. In the RIE, only the portion of the emitter layer 70 where the base electrode is formed thereof can be removed under the condition that the region of the emitter layer just underneath the overhang of the emitter contact layer 80 is not influenced by the RIE process. Various gas sources are available for the etching of the emitter layer 70, such as a mixing of $CH_4/H_2/Ar$, $HI/Cl_2$, $BCl_3/Cl_2$ and $HBr/Cl_2$.

In the present HBT 101, since the base electrode 16 directly contacts to the base layer 60 with a high carrier concentration not through the emitter layer 70 as in the previous embodiment, it is able to make an contact resistance to be enough low.

Still further advantage in the present embodiment is that the sub-collector layer 40 is entirely covered by the collector layer 50, which leads the reduction of the capacitance between the base layer 60 and the sub-collector layer 40. Thus, the high frequency performance of the HBT 101 is enhanced.

The present invention is not restricted to embodiments above described and can be modified in various manners.

It is favorable that the width of the sub-collector layer 40 is nearly equal to that of the emitter contact layer 80, although it is illustrated as the former is wider than the latter in FIGS. 1(B), from 2(A) to 2(C), from 3(A) to 3(C) and from 4(A) to 4(C). When the width of the both layers are nearly equal, the current flowing from the collector to the emitter is defined by the width, consequently the width of the intrinsic emitter is also defined. Moreover, the intrinsic emitter is enough apart from the edge of the emitter layer 70.

Moreover, although the base electrode and the emitter electrode are formed simultaneously while the collector electrode is formed in another process step in embodiments above mentioned, it is able to make all electrodes in the same time. Although the photo resist is used as an etching mask to form various mesa region, a SiN film with a etching pattern thereof instead of the photo resist is also available as the mask to make mesa regions.

As described above, the emitter contact layer made of $In_xGa_{1-x}As$ is formed so as to be smaller than the InP layer thereunder. The portion of the InP layer that contacts to the $In_xGa_{1-x}As$ layer operates as the intrinsic emitter. The intrinsic emitter is apart from edge of the InP layer. Thus, the HBT with further reliability can be provided.

From the invention thus described, it will be obvious that the embodiments may be varied in many ways. Such variations are not to be regarded as a departure from the spirit and scope of the invention, and all such modifications as would be obvious to one skilled in the art are intended for inclusion within the scope of the following claims.

What is claimed is:

1. A bipolar transistor, comprising:
   (a) a semiconductor substrate;
   (b) a sub-collector layer on said substrate;
   (c) a collector layer on said sub-collector layer;
   (d) a base layer on said collector layer and made of InGaAs;
   (e) an emitter layer made of InP on said base layer, said emitter layer being provided in a first region of said substrate; and
   (f) an emitter contact layer made of InGaAs on said emitter layer, said emitter contact layer being provided in a second region of said substrate, said first region involving said second region therein,
   wherein said emitter contact layer is formed in a region where said collector layer and said sub-collector layer are overlapped to each other.

2. The bipolar transistor according to the claim 1, further comprises a base electrode provided in a region where said base layer and said emitter layer are overlapped to each other, said emitter layer being sandwiched by said base electrode and said base layer.

3. The bipolar transistor according to the claim 2, wherein said base electrode directly contacts to said base layer.

4. The bipolar transistor according to the claim 1, wherein said emitter layer has a thickness to enable to tunnel carriers from said base electrode to said base layer.

5. The bipolar transistor according to claim 1, wherein said emitter contact layer has at least a pair of side surfaces having an inverse mesa structure.

6. The bipolar transistor according to claim 5, wherein said base electrode faces at least one of said side surfaces of said emitter contact layer.

7. The bipolar transistor according to claim 1, wherein side surfaces of said sub-collector layer have normal mesa structures.

8. A bipolar transistor operated by base injected carriers, comprising:

(a) a semiconductor substrate;

(b) a sub-collector layer on said substrate;

(c) a collector layer on said sub-collector layer;

(d) a base layer made of InGaAs on said collector layer;

(e) an emitter layer made of InP on said base layer, said emitter layer being provided in a first region of said substrate; and (f) an emitter contact layer made of InGaAs on said emitter layer, said emitter contact layer being provided in a second region of said substrate, said first region involving said second region therein, wherein said second region contains a region where said collector layer and said sub-collector layer are overlapped to each other.

9. The bipolar transistor according to claim 8, further comprises a base electrode provided in a region where said base layer and said emitter layer are overlapped to each other, said emitter layer being sandwiched by said base electrode and said base layer.

10. The bipolar transistor according to claim 9, wherein said base electrode directly contacts to said base layer.

11. The bipolar transistor according to the claim 8, wherein said emitter layer has a thickness to enable to tunnel carriers from said base electrode to said base layer.

12. The bipolar transistor according to claim 11, wherein said base electrode faces at least one of said side surfaces having inverse mesa structures.

13. The bipolar transistor according to claim 8, wherein said emitter contact layer has a pair of side surfaces having inverse mesa structures.

14. The bipolar transistor according to claim 8, wherein entire side surfaces of said sub-collector layer have normal mesa structures.

* * * * *